United States Patent [19]

van de Plassche

[11] Patent Number: 4,737,766
[45] Date of Patent: Apr. 12, 1988

[54] CODE CONVERTER WITH COMPLEMENTARY OUTPUT VOLTAGES

[75] Inventor: Rudy J. van de Plassche, Cupertino, Calif.

[73] Assignee: North American Philips Corporation, Signetics Division, Sunnyvale, Calif.

[21] Appl. No.: 907,349

[22] Filed: Sep. 12, 1986

[51] Int. Cl.[4] .............................................. H03M 1/12
[52] U.S. Cl. .............................................. 340/347 AD
[58] Field of Search ................................ 340/347 AD

[56] References Cited

FOREIGN PATENT DOCUMENTS 0120424 3/1984 European Pat. Off. .
1547918 6/1979 United Kingdom .

OTHER PUBLICATIONS

Arbel "Fast ADC" IEEE Transactions on Nuclear Science, vol. NS-22 Feb. 1975, pp. 446–451.

van de Grift et al, "A Monolithic 8-Bit Video A/D Converter," *IEEE JSSC*, Jun. 1984, pp. 374–378.
van de Plassche et al, "A High-Speed 7 Bit A/D Converter," *IEEE JSSC*, Dec. 1979, pp. 938–943.

*Primary Examiner*—Charles D. Miller
*Attorney, Agent, or Firm*—R. Meetin; J. Oisher; T. Briody

[57] ABSTRACT

A double-ended code converter (10) contains three or more like-configured amplifiers ($T_O-T_{M+1}$). Each has a first flow electrode (E1), a second flow electrode (E2), and a control electrode (CE) for receiving a signal to control charge carriers moving from the first electrode to the second. The first electrodes are coupled to a circuit supply (12) which may be a current source or a voltage supply. The second electrodes are selectively coupled to one or the other of a pair of lines ($L_B$ and $L_{BN}$) which are coupled to respective load elements ($14_B$ and $14_{BN}$) to provide a pair of complementary signals ($V_B$ and $V_{BN}$).

14 Claims, 5 Drawing Sheets

CODE CONVERTER WITH COMPLEMENTARY OUTPUT VOLTAGES

FIELD OF USE

This invention relates to code converters suitable for use in devices such as analog-to-digital (A/D) converters.

BACKGROUND ART

Speed, component count, and accuracy are important considerations in designing an A/D converter. Parallel converters provide the greatest speed in converting an analog input voltage (generally referred to as "$37 V_I$") into an n-bit digital code. A typical parallel A/D converter, such as that described in Nordstrom et al, UK Pat. No. 1,547,918, or Fujita, EPO Publication 120,424, has $2^n$ input comparators for comparing $V_I$ with a like number of reference voltages.

The comparators are differential devices. For example, each comparator in Nordstrom et al employs a pair of NPN transistors whose emitters are tied to a current source. The bases of the pair follow $V_I$ and a corresponding one of the reference voltages. The collectors provide complementary signals on a pair of lines connected to respective load elements. Each comparator is in one of two states. As $V_I$ traverses an input voltage range in one direction, a progressively greater number of the comparators provide outputs representing a particular one of the states.

A logic network operates on the "thermometer" output supplied by the comparators to generate $2^n$ circuit signals. Each circuit signal is normally logical low and reaches logical high only when $V_I$ is in a designated portion of the input range. The designated portion for each signal is separate from (i.e., does not overlap) the designated portion for each other signal. The designated portions are also spread out at approximately equal intervals across the input range. In this way, all the circuit signals are low at any time except for the one corresponding to the current value of $V_I$.

A code converter transforms the circuit signals into the digital code which is supplied on n output lines. In Nordstrom et al, the code converter consists of $2^n$ NPN transistors. Each has one or more emitters connected selectively to the output lines according to the desired coding. The code converter in Fujita is an array of like-polarity field-effect transistors (FET's) whose sources are grounded. The drains of the FET's are selectively connected to the output lines. Since the code converter in Fujita or Nordstrom et al is single ended, a reference must be used to determine whether each bit of the output code is logical low or logical high.

The main disadvantage of a parallel A/D converter is a high component count due to the large number of input comparators. The device requires a large chip area when implemented as an integrated circuit.

One of the more promising means for cutting component count is a "folding" system. See: van de Grift et al, "A Monolithic 8-Bit Video A/D Converter," *IEEE JSSC*, June 1984, pp. 374–378; and van de Plassche et al, "A High-Speed 7 Bit A/D Converter," *IEEE JSSC*, Dec. 1979, pp. 938–943. As described in each of these references, a folding A/D converter contains a coarse parallel A/D converter, a folding circuit, and a fine parallel A/D converter. The coarse converter operates directly on $V_I$ to generate the m most significant bits of the digital code. The folding circuit contains a set of input amplifiers that compare $V_I$ with at least four different reference voltages supplied from a voltage divider. The amplifiers are interconnected in such a way as to directly generate one or more pairs of complementary waveforms having a repetitive rounded triangular shape as a function of $V_I$. Extreme values of each waveform occur at $V_I$ values dependent on selected ones of the reference voltages. The fine converter operates on these waveforms to produce the remaining n-m bits.

A folding A/D converter utilizes considerably less comparators, including input amplifiers, than an equivalent parallel converter. Chip area is reduced dramatically. However, generation of the repetitive rounded triangular waveforms in the unitary way described above makes the folding converter unduly sensitive to noise. It would be desirable to have a simple technique for overcoming this problem.

GENERAL DISCLOSURE OF THE INVENTION

The central feature of this invention is a circuit that converts an input code into an output code consisting of one or more pairs of complementary signals. Due to the double-ended nature of the present code converter, there is no need to use a reference for ascertaining whether each bit of the output code is at a high level or a low level. Accuracy is thus better than that of the single-ended code converters discussed above. Frequency response is also better.

In one aspect of the invention, the present code converter employs three or more like-configured amplifiers respectively corresponding to a like number of different circuit signals that provide the input code. Each amplifier has a first flow electrode, a second flow electrode, and a control electrode for receiving the corresponding circuit signal. Charge carriers that move between the flow electrodes of each amplifier originate at its first electrode and terminate at its second electrode under control of its control electrode. The first electrodes are coupled to a current source. The second electrodes are selectively coupled to one or the other of a pair of lines in such a manner that each line is coupled to at least one of the second electrodes. In turn, the lines are coupled to respective load elements to provide a pair of largely complementary signals that constitute the output code.

In another aspect of the invention, the code converter is part of a circuit having a thermometer input section which generates the input code in response to an input parameter that varies across an input range. The input code is formed with three or more different circuit signals. Each reaches a high-level value when the parameter is in a designated portion of the input range separate from the designated portion for each other circuit signal. The designated portions are spread out at largely equal intervals across the input range. The code converter again utilizes three or more like-configured amplifiers of the type described above. The control electrode of each amplifier receives the corresponding circuit signal. When that signal reaches its high-level value, the amplifier becomes maximally conductive. The first electrodes are coupled to a voltage supply. The second electrodes are coupled in the manner disclosed above to a pair of lines coupled to respective load elements. The lines provide the complementary output code.

The instant code converter is useful in the folding circuit of a folding A/D converter. In contrast to the unitary folding circuits of prior art folding A/D converters, the folding circuit in the present A/D converter utilizes a pair of functionally different portions for generating the repetitive triangular-like waveforms. The division into two portions reduces sensitivity to noise, thereby improving accuracy.

One of the portions produces three or more circuit signals respectively associated with different pairs of four or more reference voltages. The waveform for each circuit signal has a rounded triangular shape that reaches a high-level value when the input voltage is between the associated pair of reference voltages. The other portion employs the present code converter for selectively combining these waveforms to produce the repetitive triangular waveforms.

DESCRIPTION OF THE PREFERRED EMBODIMENTS

Figure 1:
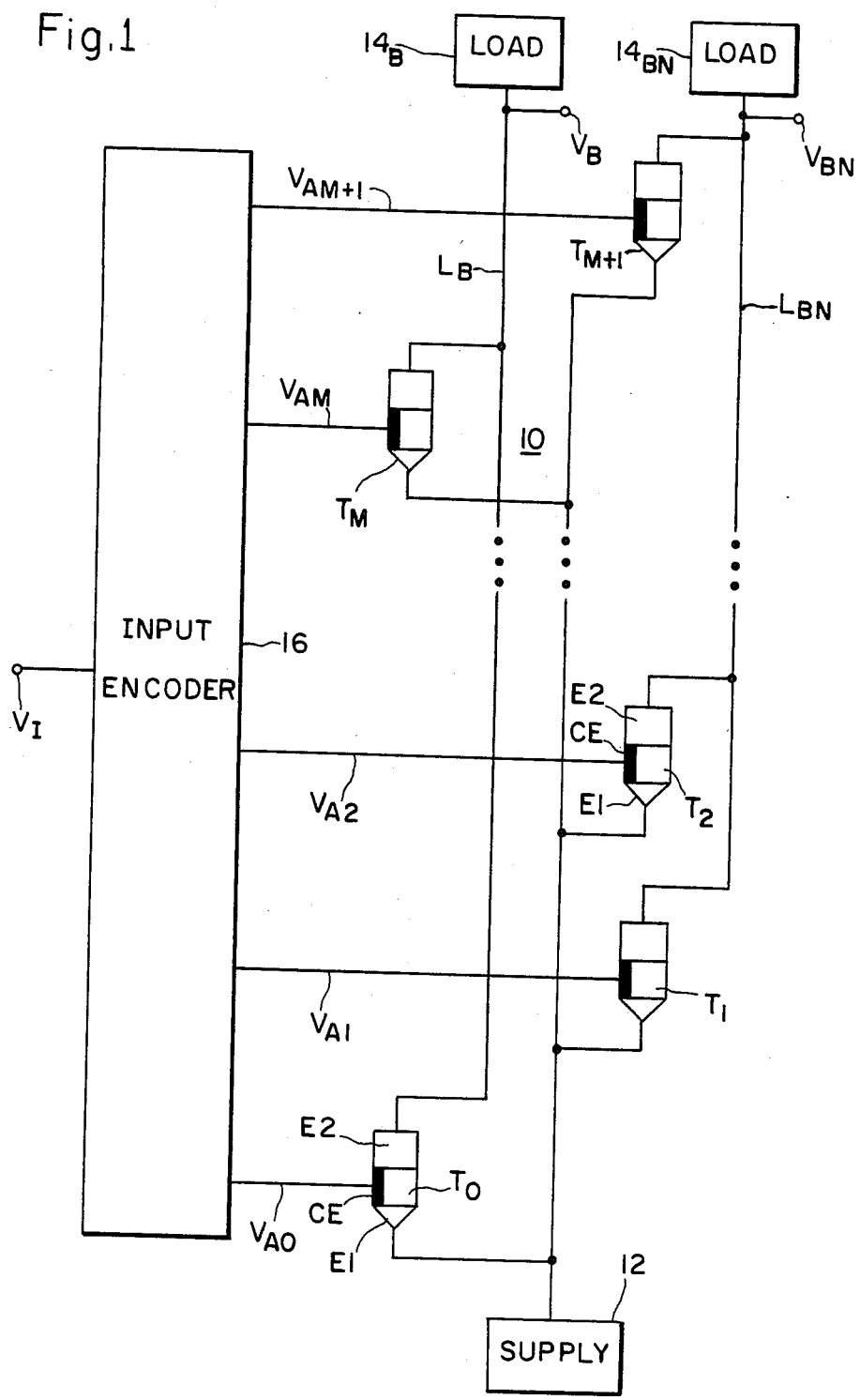
FIG. 1 is a block diagram of a circuit consisting of an encoder and a double-ended code converter according to the invention.

Referring to the drawings, FIG. 1 illustrates a circuit containing a code converter 10 which transforms an input code consisting of M+2 circuit voltages $V_{A0}$, $V_{A1}$, ... $V_{AM+1}$ into an output code consisting of largely complementary main voltages $V_B$ and $V_{BN}$. M is 1 or more. Voltages $V_{A0}$-$V_{AM+1}$ are often referred to collectively as the "$V_A$" signals. Likewise, voltages $V_B$ and $V_{BN}$ are often referred to collectively as the "$V_B$" signals.

Code converter 10 is formed with M+2 like-configured three-electrode amplifiers $T_0$, $T_1$, ... $T_{M+1}$, often referred to collectively as the "T" amplifiers. Each amplifier $T_j$ (where j runs from 0 to M+1) has a first flow electrode (E1), a second flow electrode (E2), and a control electrode (CE) for controlling current flow between the flow electrodes (E1 and E2). Charge carriers moving between the flow electrodes originate at the first electrode and terminate at the second electrode.

Each amplifier $T_j$ may be embodied with a single transistor. In the case of a bipolar transistor, its emitter, collector, and base are respectively the first, second, and control electrodes. These are the source, drain, and gate for an FET of either the insulated-gate or junction type. Amplifier $T_j$ could, however, consist of more than a single transistor. One example is a bipolar Darlington circuit in which the emitter of an input transistor is connected to the base of a trailing transistor. In this instance, the control electrode is the base of the input transistor, while the first and second flow electrodes are the emitter and collector of the trailing transistor.

As used in describing the T amplifiers, "like-configured" means that they have corresponding elements interconnected in the same way and that each set of corresponding elements is of the same semiconductor polarity. For example, the T amplifiers would generally be "like-configured" if they all are NPN transistors (even though of differing sizes), but not if some are NPN transistors while others are PNP devices. Likewise, Darlington circuits are "like-configured" as long as the input transistors are of the same polarity and the trailing transistors are of the same polarity (even if different from that of the input transistors).

Voltages $V_{A0}$-$V_{AM+1}$ are respectively supplied as input signals to the control electrodes of amplifiers $T_0$-$T_{M+1}$. Their first electrodes are all connected to a circuit supply 12 which may be a current source or a voltage supply. The second electrodes of selected ones of the T amplifiers are connected to an output line $L_B$ which is connected to a load element $14_B$ to provide voltage $V_B$. The second electrodes of the remainder are connected to an output line $L_{BN}$ which is similarly connected to a load element $14_{BN}$ to provide voltage $V_{BN}$. The particular connections of the second electrodes depend on the desired output code.

Each voltage $V_{Aj}$ varies between a low-level value and a high-level value. The adjectives "low-level" and "high-level" are used to distinguish two different signal levels. The actual voltage of the "high-level" value may be greater than or less than that of the "low-level" value, depending on the internal characteristics of the T amplifiers. For convenience, the low-level and high-level values are respectively referred to as "0" and "1". When $V_{Aj}$ is at "0", amplifier $T_j$ is substantially non-conductive. Amplifier $T_j$ is maximally conductive when $V_{Aj}$ is at "1".

The input code is normally chosen such that only one of the $V_A$ signals is at "1" at any time, the remainder all being at "0". As a result, only one of the T amplifiers is maximally conductive at any time. The maximally conductive amplifier draws current through the particular line $L_B$ or $L_{BN}$ connected to its second electrode. This pulls the corresponding main signal $V_B$ or $V_{BN}$ to a low-level value also referred to here as "0". The remainder of the T amplifiers are all turned off so that no current flows through the other line $L_{BN}$ or $L_B$. The other main signal $V_{BN}$ or $V_B$ is at a high-level value again denoted as "1". $V_B$ and $V_{BN}$ are complementary because their sum is "1".

Each of a pair of the $V_A$ signals may lie between "0" and "1" such that the sum of the two signals is "1". The remainder of the $V_A$ signals are all at "0". The corresponding pair of the T amplifiers are partially conductive. The pair form a differential device operating in its "linear" range. If the second electrodes of both of the partially conductive amplifiers are connected to the same line $L_B$ or $L_{BN}$, it conducts current to pull the corresponding signal $V_B$ or $V_{BN}$ to "0". No current flows through the other line $L_{BN}$ or $L_B$. Its signal $V_{BN}$ or $V_B$ is at "1". If the second electrode of one of the partially conductive pair is connected to line $L_B$ while the second electrode of the other is connected to line $L_{BN}$, $V_B$ and $V_{BN}$ lie between "0" and "1". Their actual values depend on the relative values of the two "non-zero" $V_{Aj}$ signals. The sum of $V_B$ and $V_{BN}$ is, however, still "1".

There are several further limitations which usually must be satisfied for $V_B$ and $V_{BN}$ to be complementary. If supply 12 is a current source that provides a substantially constant supply current, the sum of $V_B$ and $V_{BN}$ is fixed by the supply current. The current source therefore should be fully conductive. Otherwise, the sum of $V_B$ and $V_{BN}$ will differ from "1" because insufficient current flows through lines $L_B$ and $L_{BN}$. The T amplifiers normally need not be identical. However, they should be identical if supply 12 is a voltage supply, particularly when they are embodied with FET's.

An input encoder 16 generates the $V_A$ signals in response to an input parameter which varies across an input range. The input parameter is denoted generally as "$V_I$". Encoder 16 preferably sets each signal $V_{Aj}$ at "1" only when $V_I$ is in a single portion of the input range. This portion is separate from the portions of the input range where the other $V_A$ signals reach "1".

Figure 2:
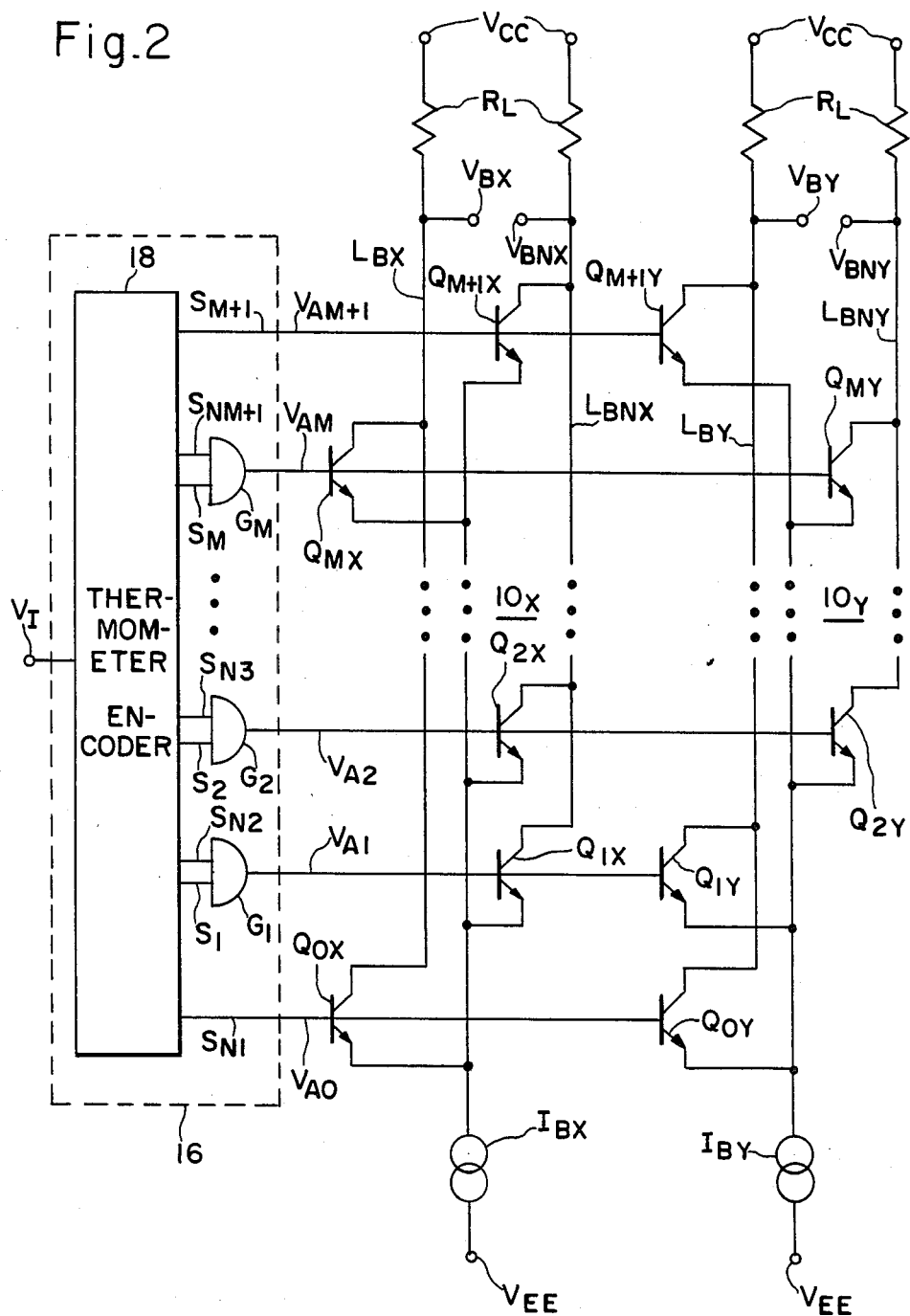
FIG. 2 is a circuit diagram of an expanded embodiment of the circuit of FIG. 1 in which the encoder produces digital signals.

FIG. 2 shows an expanded version of FIG. 1 in which the $V_A$ signals are "digital" signals. The circuit of FIG. 2 contains two code converters $10_X$ and $10_Y$. Each is a bipolar embodiment of converter 10 for which M is at least 2. Converters $10_X$ and $10_Y$ receive the same $V_A$ input code but have different second electrode (collector) connections so as to produce different $V_B$ output codes.

Dropping the subscript "X" or "Y" that distinguishes the elements of converter $10_X$ from those of converter $10_Y$, each amplifier $T_j$ of FIG. 1 is an NPN transistor $Q_j$ in FIG. 2. Supply 12 is a current source $I_B$ that provides a substantially constant supply current. Each load element $14_B$ or $14_{BN}$ is a load resistor $R_L$. Terminals $V_{CC}$ and $V_{EE}$ respectively provide high and low supply voltages.

Figure 3A:
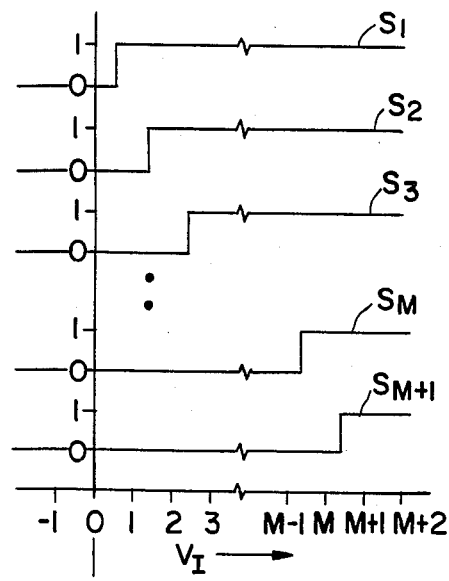
FIGS. 3a and 3b are graphs of waveforms for certain signals in this embodiment.

Input encoder 16 in FIG. 2 consists of a thermometer encoder 18 and M logical AND gates $G_1$-$G_M$. In response to parameter $V_I$, encoder 18 generates M+1 digital signals $S_1$-$S_{M+1}$ that have a "thermometer" variation of the type indicated in FIG. 3a. As $V_I$ moves in the positive direction through the input range extending here from 0 to M+1, each signal $S_j$ switches in sequence from logical "0" to logical "1". The $S_j$ transitions are very sharp. Encoder 18 also generates the respective digital complements $S_{N1}$-$S_{NM+1}$ of signals $S_1$-$S_{M+1}$. For j running from 1 to M, each gate $G_j$ logically "AND's" signals $S_j$ and $S_{Nj+1}$ to produce voltage $V_{Aj}$. $V_{A0}$ and $V_{AM+1}$ are supplied directly as signals $S_{N1}$ and $S_{M+1}$.

Figure 3B:
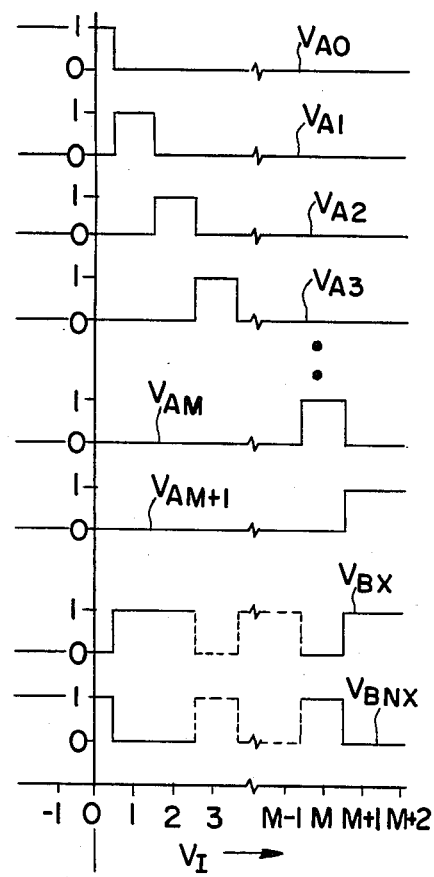

FIG. 3b illustrates how the $V_A$ signals vary as a function of $V_I$. Except for $V_{A0}$ and $V_{AM+1}$, each $V_{Aj}$ waveform sequentially rises sharply from "0" to "1", stays at "1" for a specified interval which is largely the same for all of waveforms $V_{A1}$-$V_{AM}$, and falls sharply to "0" as the next signal $V_{Aj+1}$ rises from "0" to "1". FIG. 3b also shows the resulting waveforms for signals $V_{BX}$ and $V_{BNX}$ for the particular collector connections depicted in FIG. 2 for converter $10_X$.

Figure 4:
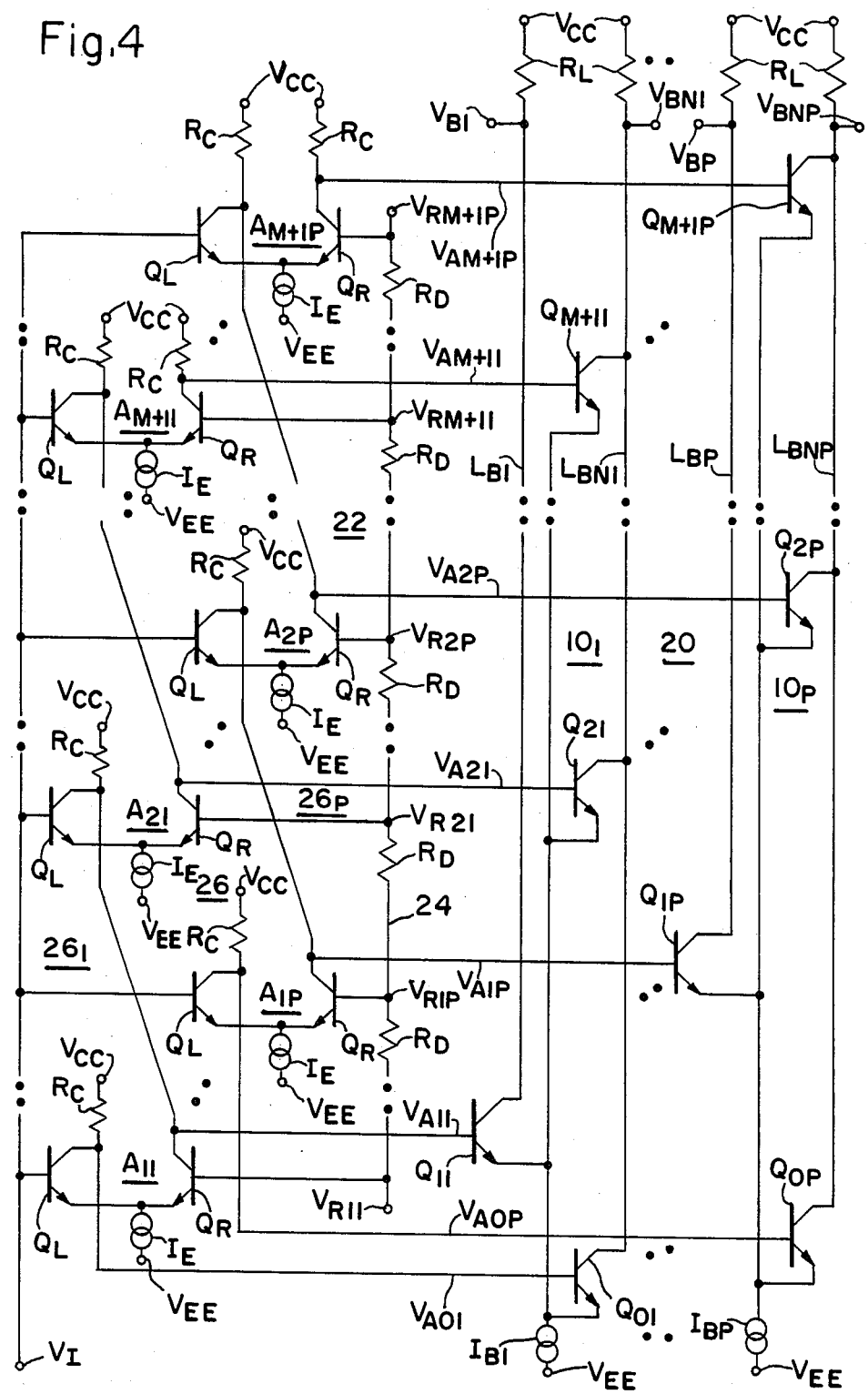
FIG. 4 is a circuit diagram of an expanded embodiment of the circuit of FIG. 1 in which the encoder produces linear signals.

FIG. 4 illustrates an expanded version of FIG. 1 in which the $V_A$ signals are "linear" signals. The circuit of FIG. 4 contains an array 20 consisting of P code converters $10_1$-$10_P$. Each converter $10_k$ (where k runs from 1 to P) is an embodiment of converter 10 utilizing the same elements as converter $10_X$ or $10_Y$ of FIG. 2. Converters $10_1$-$10_P$ have the same second electrode (collector) connections relative to one another but receive different $V_A$ input codes and thereby produce different $V_B$ output codes.

In FIG. 4, an input amplifier circuit 22 operates on parameter $V_I$, which is here an analog input voltage, to produce the $V_A$ signals. Circuit 22 is formed with a resistive voltage divider 24 and an array 26 consisting of P groups $26_1$-$26_P$ of differential amplifiers $A_{jk}$. In turn, divider 24 consists of (M+1)P−1 resistors $R_D$ connected in series between low voltage $V_{R11}$ and high voltage $V_{RM+1P}$. Including these two voltages, divider 24 provides amplifier array 26 with (M+1)P reference voltages $V_{R11}$-$V_{R1P}$ ... $V_{RM+11}$-$V_{RM+1P}$. Each amplifier group $26_k$ consists of M+1 input amplifiers $A_{1k}$-$A_{M+1k}$ that jointly provide M+2 voltages $V_{A0k}$-$V_{AM+1k}$ to respective transistors $Q_{0k}$-$Q_{M+1k}$ in converter $10_k$. Each amplifier $26_k$ in combination with divider 24 is thus an embodiment of encoder 16.

Each amplifier $A_{jk}$ amplifies the difference between voltages $V_I$ and $V_{Rjk}$. The core of amplifier $A_{jk}$ is a pair of NPN transistors $Q_L$ and $Q_R$ whose emitters are connected to a constant current source $I_{EE}$. Voltages $V_I$ and $V_{Rjk}$ are supplied to the bases of transistors $Q_L$ and $Q_R$. Their collectors are connected to respective load resistors $R_C$.

The non-inverted output of amplifier $A_{jk}$ would normally be available at the $Q_R$ collector. The $Q_L$ collector would normally provide the inverted (or complementary) output. For j running from 1 to M, each signal $V_{Ajk}$ is taken from a connection of the $Q_R$ collector in amplifier $A_{jk}$ to the $Q_L$ collector in amplifier $A_{j+1k}$. This acts to "linearly AND" the non-inverted $A_{jk}$ output and the inverted $A_{j+1k}$ output. Components 24 and $26_k$ thus perform a "linear" function similar to the "digital" function performed by components 18 and $G_1$-$G_M$ in FIG. 2.

Figure 5:
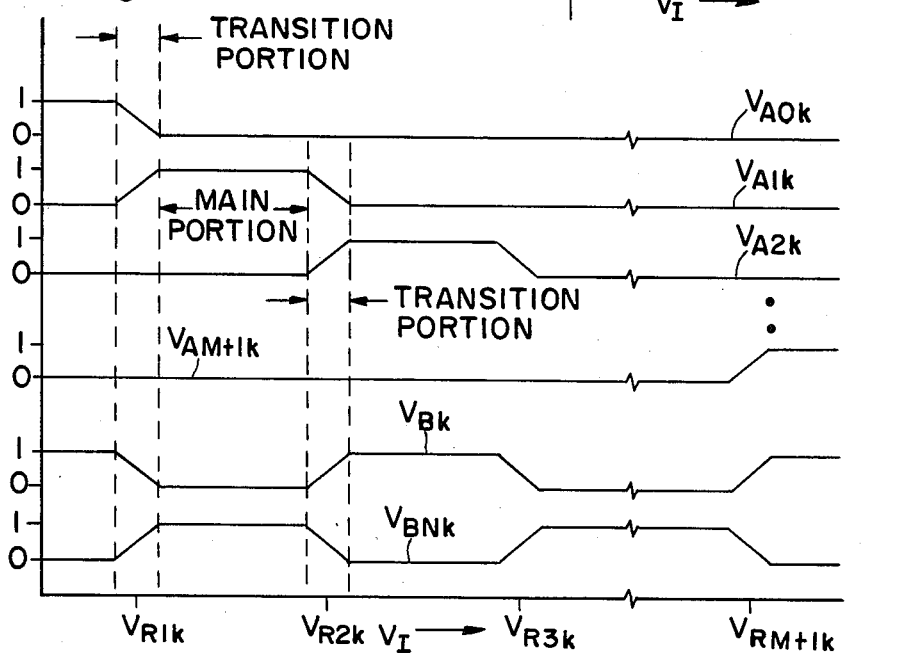
FIG. 5 is a graph of the waveforms for certain signals in this embodiment.

FIG. 5 generally illustrates how $V_{A0}$-$V_{AM+1k}$ vary with $V_I$. Except for voltages $V_{A0k}$ and $V_{AM+1k}$, each voltage $V_{Ajk}$ sequentially rises from "0" to "1" in a transition portion of the input range centered around $V_{Rjk}$, stays at "1" in a main portion of the $V_I$ range extending from slightly above $V_{Rjk}$ to slightly below $V_{Rj+1k}$, and then falls to "0" in another transition portion centered around $V_{Rj+1k}$ as the next voltage $V_{Aj+1k}$ rises from "0" to "1". Voltages $V_{A0k}$ and $V_{AM+1k}$, which each make only a single transition, respectively account for underflow and overflow. Each transistor $Q_{jk}$ becomes progressively more conductive as its input voltage $V_{jk}$ moves from "0" to "1" and vice versa. The transitions in $V_{A0k}$-$V_{AM+1k}$ are thereby reflected in $V_{Bk}$ and $V_{BNk}$ as shown in FIG. 5.

Resistors $R_D$ preferably all have the same value. Consequently, the "main" portions of the $V_I$ range all have approximately the same pulse width and are spread out at approximately equal intervals from one another. By suitably adjusting the $R_D$ values, each main portion can be compressed to a single point.

Figure 6:
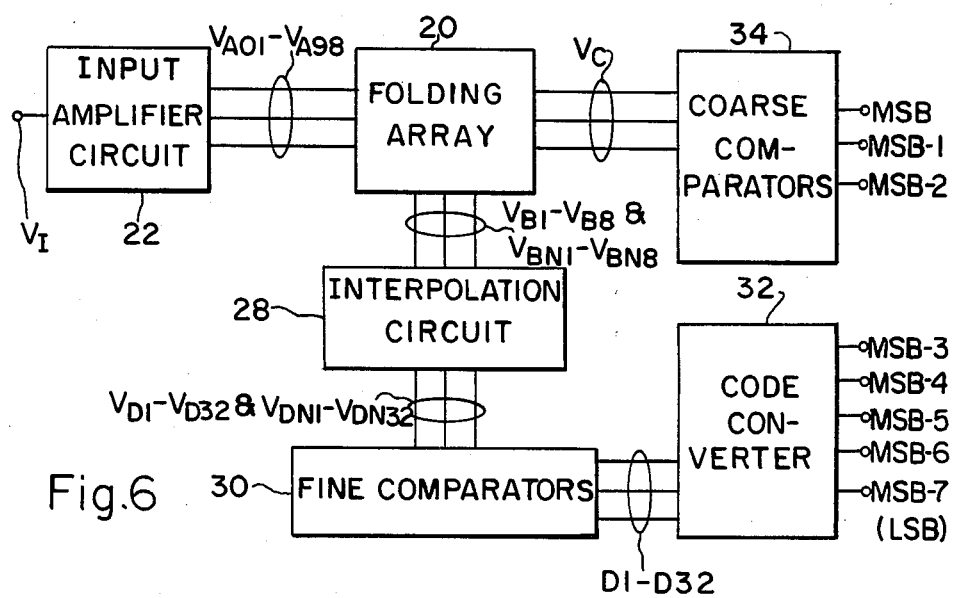
FIG. 6 is a block diagram of a folding A/D converter utilizing the encoding and code converting circuitry of FIG. 4.

FIG. 6 illustrates an application of the encoding and code converting circuitry of FIG. 4 to an A/D converter of the multiple-folding type. This device converts analog voltage $V_I$ into an 8-bit digital code. M and P are both 8 here. The input section to the A/D converter is circuit 22 in which divider 24 provides 72 reference voltages $V_{R11}$-$V_{R98}$. Amplifier array 26 in circuit 22 compares $V_I$ with each of $V_{R11}$-$V_{R98}$ to produce 80 circuit voltages $V_{A01}$-$V_{A98}$. Components 20 and 22 may include some additional circuitry to assume that the $V_A$ signals produce the necessary shapes for the $V_B$ signals at the low and high ends of the $V_I$ range.

Figure 7A:
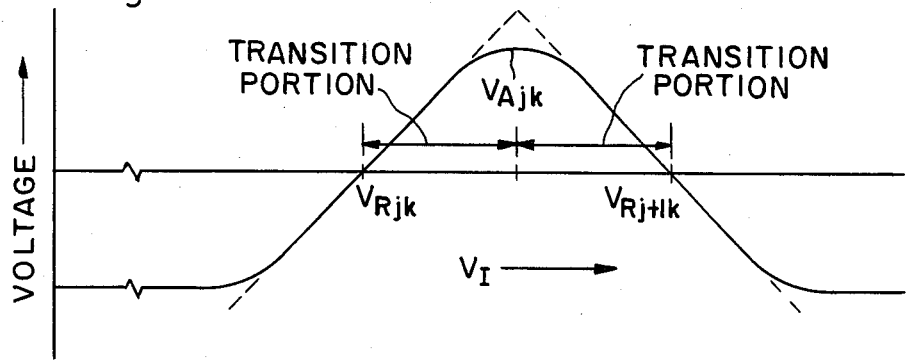
FIGS. 7a and 7b are graphs of waveforms for the respective input and output codes of the code converting circuitry.

For j and k each running from 1 to 8, FIG. 7a illustrates the general shape for $V_{Ajk}$ as a function of $V_I$.

Each $V_{Ajk}$ waveform would ideally have the triangular shape shown in dashed line. Due to practical amplifier characteristics, $V_{Ajk}$ varies according to the more rounded shape indicated in solid line. $V_{Ajk}$ reaches a maximum when $V_I$ is approximately half way between $V_{Rjk}$ and $V_{Rj+1k}$.

Figure 7B:
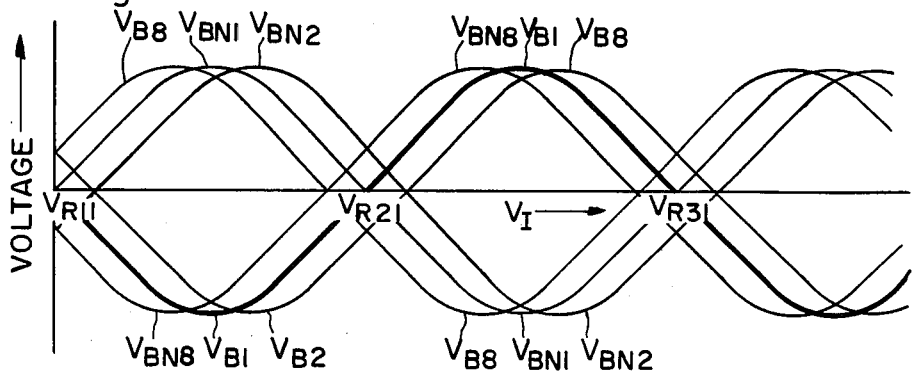

Circuit 20, here acting as a folding array, electrically combines selected $V_A$ signals in the manner described above to generate 8 voltages $V_{B1}$-$V_{B8}$ and their complements $V_{BN1}$-$V_{BN8}$. FIG. 7b depicts part of the resulting $V_B$ waveforms. $V_{B1}$ is shown in thicker line. The remaining waveforms have the same shape and spacing as those illustrated. Due to the roundings of the tips of the $V_A$ waveforms, each $V_B$ waveform has a repetitive rounded triangular shape. Each voltage $V_{Bk}$ or $V_{BNk}$ reaches extreme values when $V_I$ is approximately halfway between each pair of voltages $V_{Rjk}$ and $V_{Rj+1k}$.

Returning to FIG. 6, an interpolation circuit 28 interpolates by a factor of 4 between each pair of consecutive $V_B$ signals to generate 32 interpolated signals $V_{B1}$-$V_{B32}$ and their complements $V_{NB1}$-$V_{NB32}$. Applicant's pending U.S. Pat. application Ser. No. 809,453, filed Dec. 16, 1985, discloses a suitable resistive interpolation circuit for this purpose. A group of comparators 30 compares $V_{B1}$-$V_{B32}$ respectively with $V_{NB1}$-$V_{NB32}$ to produce a string of 32 bits D1–D32. A code converter 32, which may be conventional or may follow the teachings of this invention, converts the bit string into the five least significant bits MSB-3–MSV-7 of the digital code.

The final part of the A/D converter is a group of comparators 34 which generate the three most significant bits MSB–MSB-2 in response to three pairs of substantially complementary further signals $V_C$. For convenience, FIG. 6 indicates that array 20 provides the $V_C$ signals.

While the invention has been described with reference to particular embodiments, this description is solely for the purpose of illustration and is not to be construed as limiting the scope of the invention claimed below. For example, some or all of the $V_A$ signals could rise to their high-level values at two or more separate places in the input range. Various changes, modifications, and applications may thus be made by those skilled in the art without departing from the true scope and spirit of the invention as defined by the appended claims.

I claim:

1. An electronic circuit comprising a current source, two load elements respectively coupled to two lines, and at least three like-configured amplifiers respectively corresponding to a like number of different circuit signals, each amplifier having a first flow electrode, a second flow electrode, and a control electrode for receiving the corresponding circuit signal, charge carriers that move between the flow electrodes of each amplifier originating at its first electrode and terminating at its second electrode under control of its control electrode, the first electrodes of a specified pair of the amplifiers coupled to the current source, the second electrodes of the specified pair respectively coupled to the lines which provide respective signals that are largely complementary substantially whenever the current source is fully conductive, characterized in that a third specified one of the amplifiers has its first electrode coupled to the current source and its second electrode coupled to a selected one of the lines.

2. A circuit as in claim 1 characterized in that a fourth specified one of the amplifiers has its first electrode coupled to the current source and its second electrode coupled to a selected one of the lines.

3. A circuit as in claim 1 characterized in that each amplifier comprises a bipolar transistor having an emitter, a collector, and a base, which are respectively the first, second, and control electrodes of that amplifier.

4. A circuit as in claim 1 characterized in that each amplifier comprises a field-effect transistor having a source, a drain, and a gate which are respectively the first, second, and control electrodes of that amplifier.

5. A circuit as in claim 1 characterized in that the circuit signal to each specified amplifier is substantially a digital signal switching between a low-level value at which the amplifier is turned off and a high-level value at which the amplifier is turned on, only one of the circuit signals to the specified amplifiers being at its high-level value at any time, whereby substantially only one of the specified amplifiers is turned on at any time.

6. A circuit as in claim 1 characterized in that each specified amplifier becomes progressively more conductive as its circuit signal moves from a low-level value where the amplifier is substantially non-conductive to a high-level value where the amplifier is maximally conductive, the circuit signals to the specified amplifiers are linear signals dependent on an input parameter which varies across an input range, each linear signal reaches its high-level value when the parameter is in a designated portion of the input range and moves to its low-level value as the parameter traverses either of a pair of transition portions sandwiched about the designated portion which is spaced apart from the designated portion for each other linear signal, and each transition portion except the two most distant transition portions overlaps precisely one of the other transition portions, whereby two of the specified amplifiers may be conductive at any time.

7. A circuit as in claim 1 characterized in that the circuit signals depend on an input parameter which varies across an input range, each amplifier is maximally conductive when its circuit signal is at a high-level value occurring when the parameter is in a designated portion of the input range separate from the designated portion for each other circuit signal, and the designated portions are spread out at largely equal intervals across the input range.

8. A circuit as in claim 1 characterized by a further current source and two load elements respectively coupled to two further lines, the first electrodes of three further ones of the amplifiers coupled to the further current source, the second electrodes of the further amplifiers selectively coupled to one or the other of the further lines in such a manner that each further line is coupled to the second electrode of at least one of the further amplifiers, the further lines providing respective signals which are largely complementary substantially whenever the further current source is fully conductive.

9. An electronic circuit in which an input section provides at least three different circuit signals that vary between a high-level value and a low-level value in response to an input parameter which varies across an input range, each circuit signal reaches the high-level value when the parameter is in a designated portion of the input range separate from the designated portion for each other circuit signal, and the designated portions are spread out at largely equal intervals across the input range, characterized by: two load elements respectively coupled to two lines; and at least three like-configured amplifiers respectively corresponding to the circuit signals, each amplifier having a first flow electrode, a second flow electrode, and a control electrode for receiving the corresponding circuit signal so as to cause the amplifier to become maximally conductive when that signal is at the high-level value, charge carriers that move between the flow electrodes of each amplifier originating at its first electrode and terminating at its second electrode under the control of its control electrode, the first electrodes coupled to a source of a supply voltage, the second electrodes selectively coupled to one or the other of the lines in such a manner that each line is coupled to at least one of the second electrodes, the designated portions being sufficiently close to one another that the lines provide largely complementary signals.

10. A circuit as in claim 9 characterized in that the amplifiers are substantially identical.

11. A circuit as in claim 10 characterized in that each amplifier comprises a field-effect transistor having a source, a drain, and a gate which are respectively the first, second, and control electrodes of that amplifier.

12. An electronic circuit for converting an analog input voltage which varies across an input range into a digital code, there being: reference means for providing at least four different reference voltages spread out across the input range; means responsive to the input and reference voltages for generating at least one pair of largely complementary main signals, the voltage waveform for each main signal as a function of the input voltage being of a repetitive rounded triangular shape with extreme values occurring at values of the input voltage dependent on selected ones of the reference voltages; and means for operating on the main signals to generate at least part of the digital code; characterized in that the means for generating comprises:

means for producing at least three circuit signals respectively, associated with different pairs of the reference voltages, the voltage waveform for each circuit signal as a function of the input voltage reaching a high-level value when the input voltage is at a specified value between the associated pair of reference voltages and moving to a low-level value as the input voltage moves away from the specified value; and at least one code converter, each comprising;
  a circuit supply which is either a current source or a voltage supply;
  two load elements respectively coupled to two lines; and
  at least three like-configured amplifiers respectively corresponding to the circuit signals, each amplifier having a first flow electrode, a second flow electrode, and a control electrode for receiving the corresponding circuit signal, charge carriers that move between the flow electrodes of each amplifier originating at its first electrode and terminating at its second electrode under control of its control electrode, the first electrodes of three specified ones of the amplifiers coupled to the supply, the second electrodes of the specified amplifiers selectively coupled to one or the other of the lines in such a manner that each line is coupled to the second electrode of at least one of the specified amplifiers, the lines providing a pair of the main signals.

13. A circuit as in claim 12 characterized that each amplifier is a bipolar transistor having an emitter, a collector, and a base which are respectively the first, second, and control electrodes of that amplifier.

14. A circuit as in claim 13 characterized in that each circuit supply is a current source.

* * * * *